(12) United States Patent
Sribhashyam et al.

(10) Patent No.: US 7,317,340 B2
(45) Date of Patent: Jan. 8, 2008

(54) GLITCH FREE RESET CIRCUIT

(75) Inventors: Sarathy Sribhashyam, San Jose, CA (US); David Hoff, Alameda, CA (US); Ken Ming Li, Santa Clara, CA (US)

(73) Assignee: Altera Coporation, San Jose, CA (US)

( * ) Notice: Subject to any disclaimer, the term of this patent is extended or adjusted under 35 U.S.C. 154(b) by 0 days.

(21) Appl. No.: 11/365,068

(22) Filed: Feb. 28, 2006

(65) Prior Publication Data
US 2006/0145727 A1  Jul. 6, 2006

Related U.S. Application Data

(62) Division of application No. 09/944,963, filed on Aug. 31, 2001, now abandoned.

(51) Int. Cl.
*G01R 29/02* (2006.01)
*H03K 9/08* (2006.01)

(52) U.S. Cl. .......................................... 327/34; 327/36

(58) Field of Classification Search .................. 327/34, 327/36
See application file for complete search history.

(56) References Cited
U.S. PATENT DOCUMENTS 4,760,279 A * 7/1988 Saito et al. .................. 327/34
5,748,034 A * 5/1998 Ketineni et al. ............. 327/551
6,249,141 B1 * 6/2001 Aspacio et al. ................ 326/29

FOREIGN PATENT DOCUMENTS

JP          05243923 A  *  9/1993

* cited by examiner

*Primary Examiner*—Quan Tra
(74) *Attorney, Agent, or Firm*—Martine Penilla & Gencarella, LLP

(57) ABSTRACT

An apparatus for compensating for glitch occurrence in a reset signal that is applied in an integrated circuit, includes: a logic stage capable to process an incoming signal and a delayed incoming signal that is a delayed version of the incoming signal, the logic stage capable to generate an output signal so that when the incoming signal and the delayed incoming signal are in the same state, the output signal will be in the same state. An apparatus for compensating for glitch occurrence in a reset signal that is applied in an integrated circuit, includes: a logic stage capable to process an incoming signal and a delayed incoming signal that is a delayed version of the incoming signal, the logic stage capable to generate an output signal so that when the incoming signal and the delayed incoming signal are in the same state, the output signal will have a state similar to the state of the incoming signal, and when the incoming signal and the delayed incoming signal are not in the same state, the output signal will have a state similar to a previously sampled state of the incoming signal.

10 Claims, 11 Drawing Sheets

Sample-Hold Circuit

FIG. 5  Reset Signal Going High

Method of Compensating for Glitch Occurrence

FIG. 9 Sample-Hold Circuit

GLITCH FREE RESET CIRCUIT

CROSS REFERENCE TO RELATED APPLICATIONS

This application is a divisional application of U.S. patent application Ser. No. 09/944,963, filed Aug. 31, 2001 and entitled "Glitch Free Reset Circuit" which parent Application is herein incorporated by reference now abandoned.

FIELD OF THE INVENTION

This disclosure relates generally to integrated circuits that are used in, for example, computing devices, and more particularly but not exclusively, to circuits and methods that solve the problem of glitches occurring in a reset signal that is applied to an integrated circuit on a circuit board. The present invention also relates more particularly to circuits and methods that enhance the operation of integrated circuits.

BACKGROUND

When an integrated circuit (i.e., a chip or part) is on a circuit board, the reset signal applied to the integrated circuit usually has glitches, and these glitches can lock up the integrated circuit, as well as prevent the integrated circuit from functioning. Thus, it is desirable to eliminate such glitches from the reset signals and enhance the operation of the integrated circuit. Conventionally, a glitch free reset signal is obtained from the circuit board. In conventional approaches, emphasis was typically based on eliminating such glitches on the reset signals that are applied to the integrated circuit.

However, as the number of cards on the circuit board increases, the likelihood of completely eliminating a glitch in a reset signal from the circuit board decreases. Accordingly, improvements are needed with regard to solving the problem of glitches that occur in reset signals that are applied to integrated circuits.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Figure 1:
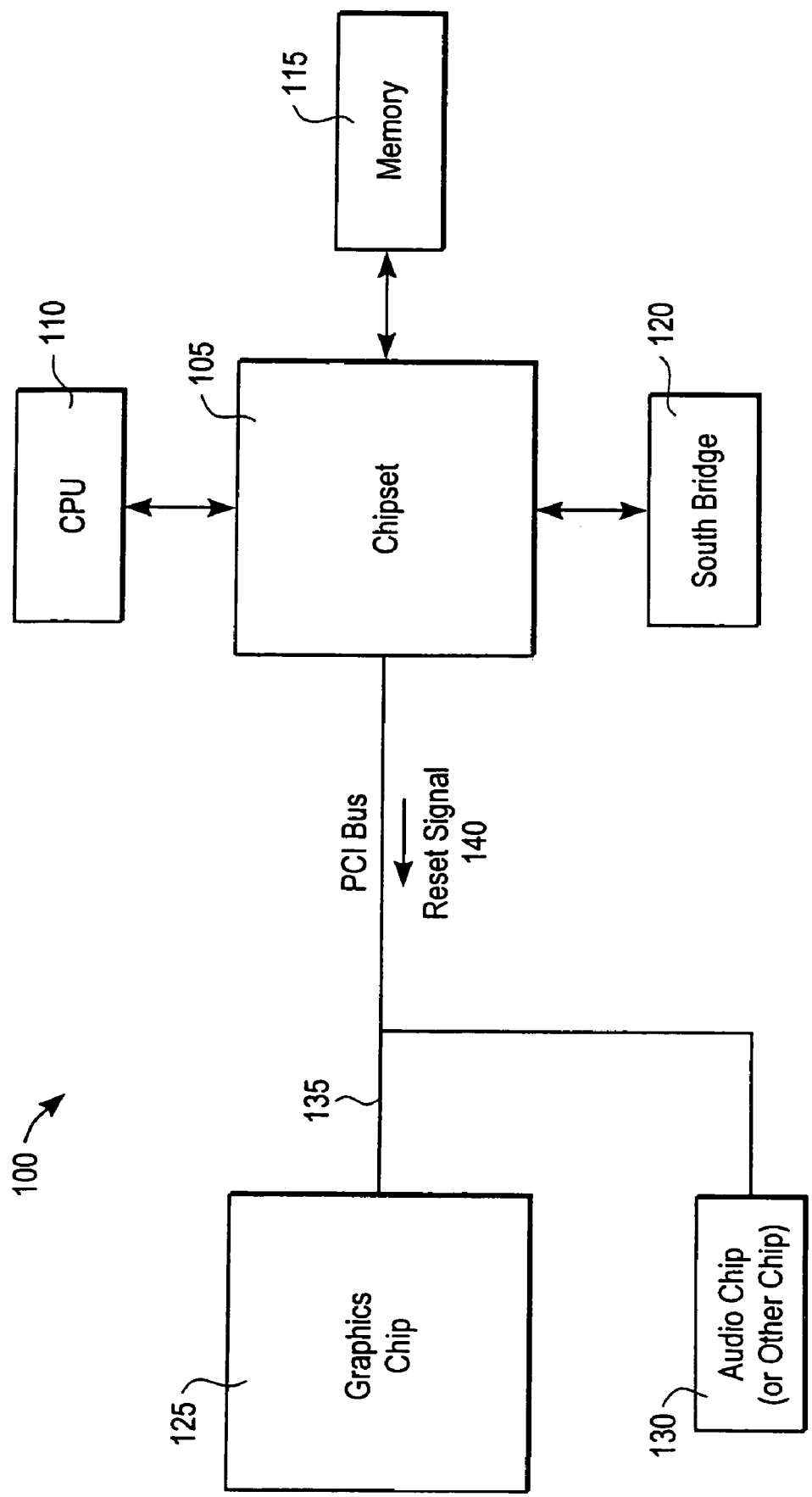
FIG. 1 is a block diagram of a system that is typically implemented in, for example, a personal computer.

Embodiments of systems and methods for compensating for a glitch occurrence in a reset signal are disclosed herein. As an overview, an embodiment of the invention provides a reset circuit that compares an original reset signal with a delayed version of the reset signal. When the reset circuit detects both the original non-delayed reset signal and the delayed version of the reset signal to be in the same state, then that state (which is output from an S-R flop) is applied to the appropriate components of an integrated circuit.

In another embodiment, a reset circuit receives an incoming reset signal "reset" and delays an incoming reset signal to generate a delayed reset signal "delayed_reset". The reset circuit compares the non-delayed reset signal with the delayed_reset signal. When both the non-delayed reset signal and the delayed reset signal are in the same state (asserted state or non-asserted state), then the non-delayed reset signal is sampled as the output value "OUTB". On the other hand, if the non-delayed reset signal and the delayed_reset signal are not in the same state, then the non-delayed reset signal is not sampled, and the previously sampled state of the non-delayed reset signal is held as the output value "OUTB". The output value "OUTB" determines the value of the reset signal that is applied to the appropriate components of an integrated circuit.

The present invention advantageously solves the problem of glitch occurrences in reset signals that are applied to integrated circuits. The present invention also advantageously provides circuits and methods that are very versatile and that may be selectively used anywhere on the circuit board to eliminate glitches in signals. The present invention may also advantageously provide circuits and methods that effectively eliminate small glitches in reset signals by minimizing the signal delay and that effectively eliminate larger glitches in reset signals by increasing the signal delay. Thus, the present invention may advantageously enhance the operation of integrated circuits on a circuit board.

In the description herein, numerous specific details are provided, such as the description of system components in FIGS. 1 through 11, to provide a thorough understanding of embodiments of the invention. One skilled in the relevant art will recognize, however, that the invention can be practiced without one or more of the specific details, or with other systems, methods, components, materials, parts, and/or the like. In other instances, well-known structures, materials, or operations are not shown or described in detail to avoid obscuring aspects of the invention.

Reference throughout this specification to "one embodiment", "an embodiment", or "a specific embodiment" means that a particular feature, structure, or characteristic described in connection with the embodiment is included in at least one embodiment of the present invention. Thus, the appearances of the phrases "in one embodiment", "in an embodiment", or "in a specific embodiment" in various places throughout this specification are not necessarily all referring to the same embodiment. Furthermore, the particular features, structures, or characteristics may be combined in any suitable manner in one or more embodiments.

Additionally, the signal arrows in the drawings/figures are considered as exemplary and are not limiting, unless otherwise specifically noted. Furthermore, the term "or" as used in this disclosure is generally intended to mean "and/or" unless otherwise indicated. Combinations of components or steps will also be considered as being noted, where terminology is foreseen as rendering the ability to separate or combine is unclear.

It will also be appreciated that one or more of the elements depicted in the drawings/figures can also be implemented in a more separated or integrated manner, or even removed or rendered as inoperable in certain cases, as is useful in accordance with a particular application.

Referring in detail now to the drawings wherein similar parts of the present invention are identified by like reference numerals, and initially referencing FIG. 1 as a preamble for better understanding the need for the present invention, there is seen a block diagram of a conventional system 100 including a chipset 105, central processing unit (CPU) 110, memory 115, southbridge 120, graphics chip 125, and audio chip (or other type of chip) 130. The system 100 may or may not include the graphics chip 125 or audio chip 130. Other types of chips may also be included (or may instead be included) in the system 100.

The conventional system 100 is of the type that may be implemented in, for example, a personal computer (PC). The chipset 105, graphics chip 125, and audio chip 130 are coupled together by a bus 135 such as, for example, a peripheral component interconnect (PCI) bus.

As known to those skilled in the art, a chipset is a number of integrated circuits designed to perform one or more related functions. For example, one chipset may provide the basic functions of a modem while another chipset provides the central processing unit (CPU) functions for a computer. Newer chipsets generally include functions provided by two or more older-type chipsets. In some cases, older-type chipsets that require two or more physical chips can be replaced with a chipset on one chip. The chipset 105 communicates with the CPU 110, memory 115, and southbridge 120. The CPU 110 can only communicate directly with the chipset 105. Thus, if the CPU 110 will retrieve data from the memory 115, the CPU 110 will instruct the chipset 105 to retrieve the data from memory 115, and data is then transferred by the chipset 105 from the memory 115 to the CPU 110. Similarly, if the graphics chip 125 or audio chip 130 will retrieve data from the memory 115, the graphics chip 125 or audio chip 130 will instruct the chipset 105 to retrieve the data from memory 115, and data is then transferred by the chipset 105 from the memory 115 to the graphics chip 125 or audio chip 130.

The chipset 105 may be of the type available from, for example, Via Technology, Incorporated, Fremont, Calif. or Intel Corporation, Santa Clara, Calif. The CPU 110 may be of the type available from, for example, Intel Corporation or Motorola Incorporated. The memory 115 may be, for example, a dynamic random access memory (DRAM) for serving as a main memory device.

As known to those skilled in the art, a southbridge is the integrated circuit in a core logic chip set that controls the integrated drive electronics (IDE) bus, universal serial bus (USB), plug-n-play support, the Peripheral Component Interconnect Industry Standard Architecture (PCI-ISA) bridge, keyboard/mouse controller, power management, and various other features. One particular southbridge brand provides sound card functions.

The graphics chip 125 may be of the type available from, for example, S3 Graphics, Incorporated, Fremont, Calif., while the audio chip 130 may be of the type available from various manufacturers.

As also known to those skilled in the art, a PCI bus is a local bus standard developed by Intel Corporation. Most modern personal computers include a PCI bus in addition to a more general ISA expansion bus. PCI is also used on newer versions of the Macintosh computer from Apple Computers Corporation, Cupertino, Calif.

The chipset 105 sends a reset signal 140 via bus 135 to the graphics chip 125, audio chip 130, and other chips coupled to the bus 135 before the chipset 105 begins communication with these chips. However, in practice, since multiple chips (e.g., graphics chip 125 and audio chip 130) share the bus 135, the reset signal 140 will not be smooth in form and will include a glitch that adversely impacts the operation of the system 100. In this conventional system 100, components are typically used to try to eliminate glitch occurrence in the reset signal. However, as number of integrated circuits on the circuit board increases, the likelihood of completely eliminating a glitch in a reset signal 140 decreases.

Figure 2:
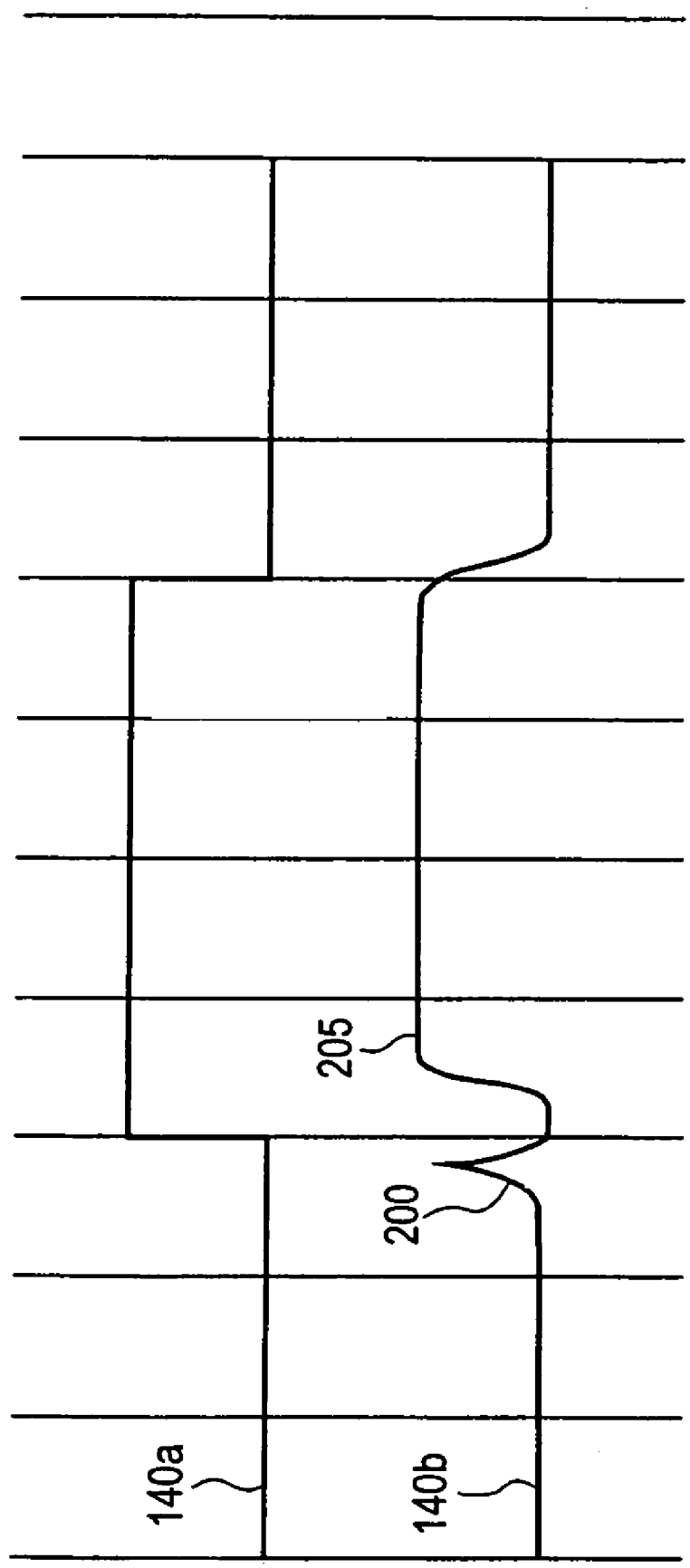
FIG. 2 is a waveform diagram of a reset signal in ideal form and a waveform diagram of a practical reset signal that includes a glitch.

FIG. 2 shows a waveform diagram of a reset signal 140a (generated by chipset 105) in ideal form. The reset signal 140a may typically not include any glitches if multiple integrated circuits do not share the bus 135.

FIG. 2 also shows a waveform diagram of a reset signal 140b which is generated by the chipset 105 in practical implementations. The reset signal 140b includes a glitch 200 that is the result of a multiple number of integrated circuits sharing the bus 135. Typically, the glitch 200 detrimentally triggers the reset on some parts of the graphics chip 125 and/or on some part of the other integrated circuits that share the bus 135. Since the glitch 200 appears at a high level for only a very short time frame, the reset that is triggered by the glitch 200 is only applied to apart of the graphics chip 125 and is not applied to the entirety of the graphics chip 125. As a result, when the actual reset 205 is received by graphics chip 125, reset is again triggered in graphics chip 125. This results in the graphics chip 125 in becoming locked (crashing) because some components in graphics chip 125 have already been reset by the previous glitch 200, while some components in graphics chip 125 have not been reset by glitch 200. This result is due to the components that are reset by glitch 200 in performing their programmed operations after being reset. Thus, the reset triggered by the glitch 200 results in mistiming that leads to the locking in graphics chip 125 when the actual subsequent reset portion 205 is received by the components of the graphics chip 125. It is understood that the audio chip 130 and any other chip coupled to the bus 135 is also subject to negative effects of the glitch 200 as described above.

Figure 3:
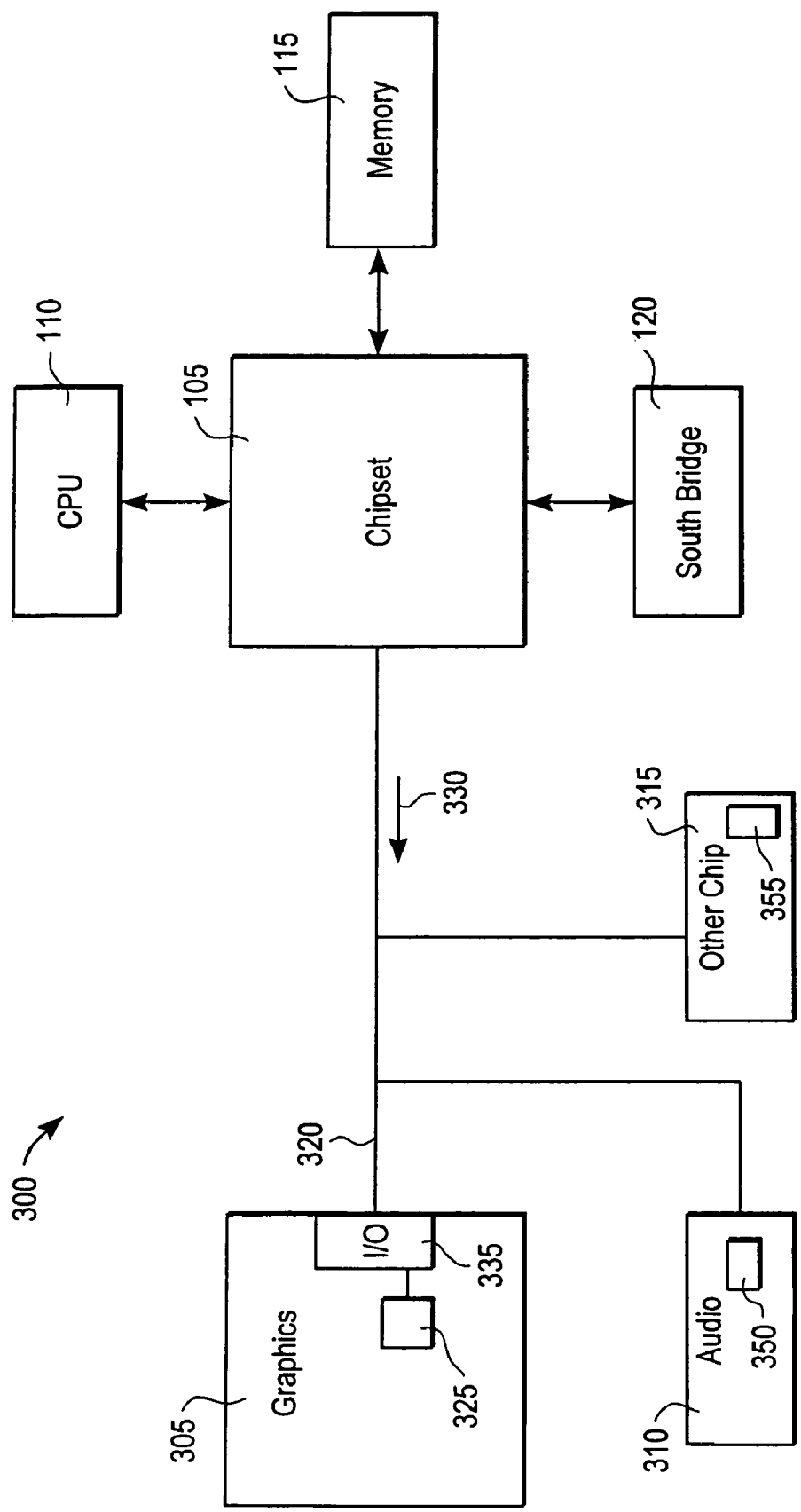
FIG. 3 is a schematic block diagram of a system that is capable of compensating for glitches in a reset signal, in accordance with an embodiment of the present invention.

FIG. 3 is a schematic block diagram of a system 300 that is capable of compensating for glitches in a reset signal, in accordance with an embodiment of the present invention. The system 300 may include a graphics chip 305 and/or an audio chip 310 and/or other types of chip 315. The graphics chip 305, audio chip, and other chip 315 are coupled via a bus 320 to the chipset 105. The bus 320 may be, for example, a PCI bus. In FIG. 3, additional chips may also be coupled to (or may instead be coupled to) the bus 320, or only one or some of the graphics chip 305, audio chip 310, or other chip 315 may be coupled to the bus 320.

In one embodiment, the present invention provides a reset circuit 325 which compensates for glitch occurrence in a reset signal 330. For purposes of explaining the functionality of the present invention, the reset circuit 325 is shown as being included in the graphics chip 305. However, other reset circuits in accordance with an embodiment of the present invention may also be included in the audio chip 310, in the other chip 315 and/or in other integrated circuits that may be coupled to the bus 320. For example, the audio chip 310 may include a reset circuit 350 in accordance with an embodiment of the present invention. The other chip 315 may include a reset circuit 355 in accordance with an embodiment of the present invention.

It is also noted that in the embodiment shown in FIG. 3, the reset circuit 325 is shown as being an internal component of the graphics chip 305. However, the reset circuit 325 may also be external to the graphics chip 305 or may be a separate module or component that is coupled to the graphics chip 305. Similarly, the reset circuit 350 may also be external to the audio chip 310 or may be a separate module or component that is coupled to the audio chip 310. The reset circuit 355 may also be external to the other chip 355 or may be a separate module or component that is coupled to the other chip 355.

In FIG. 3, the reset circuit 325 has an input coupled to an input/output (I/O) interface 335 for receiving the reset signal 330 in the graphics chip 305. The reset circuit 325 generates output reset signals which reset all appropriated components in the graphics chip 305. Similarly, the reset circuit 350 generates output reset signals which reset all appropriate components in the audio chip 310, while the reset circuit 355 generates reset signals which reset all appropriate components in the other chip 355. In one embodiment, the reset circuit 325 uses a set/reset (S-R) flop to recognize the exact state of the reset signal 330. For purposes of explaining the functionality of the invention, only the function of the reset circuit 325 is explained in detail. It is understood, however, that the reset circuits 350 and 355 function in a manner similar to the reset circuit 325.

Figure 4:
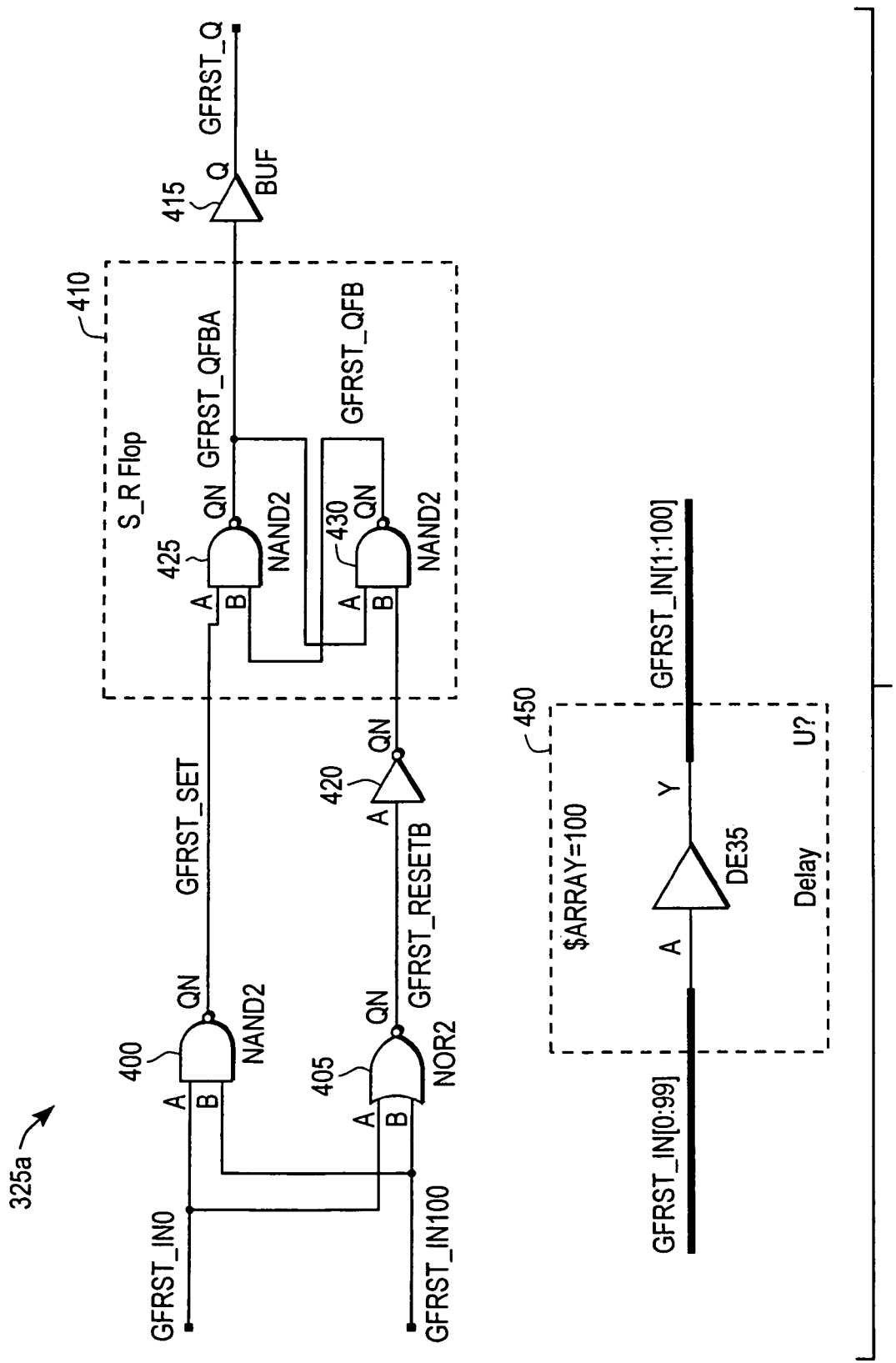
FIG. 4 is a schematic circuit diagram of one embodiment of the reset circuit of FIG. 3.

FIG. 4 is a schematic circuit diagram of one embodiment of the reset circuit 325 of FIG. 3. The reset circuit 325a compares the original reset signal 330 with a delayed version of the reset signal 330. When the reset circuit 325a detects both the original non-delayed reset signal 330 and the delayed version of the reset signal 330 to be in the same state, then that state (which is output from the S-R flop) is applied to the appropriate components of the graphics chip 305.

In the embodiment illustrated in FIG. 4, the reset circuit 325a includes a NAND gate 400 and a NOR gate 405. The output of the NAND gate 400 is coupled to a set-reset (S-R) flop 410 which has an output coupled to a buffer 415. The output of NOR gate 405 is coupled to an inverter 420 which has an output coupled to the S-R flop 410. In one embodiment, the S-R flop 410 includes a NAND gate 425 and a NAND gate 430. The NAND gate 425 has a first input coupled to the output of the NAND 400. The output of the NAND gate 425 is coupled to the input of the buffer 415. The NAND gate 430 has a first input coupled to the output of the NAND gate 425 and a second input coupled to the output of the inverter 420. The output of NAND gate 430 is coupled to the second input of NAND gate 425.

The reset circuit 325a uses the S-R flop 410 to recognize the exact state of a reset signal. The reset signal is delayed and then compared with the original, non-delayed reset signal. When both the delayed reset signal and the original, non-delayed reset signal are in the same state (asserted state or un-asserted state), a set or a reset occurs in the S-R flop 410. The output of the S-R flop 410 is fed to all appropriate circuits and components in an integrated circuit that implements the reset circuit 325a.

Various features in FIG. 4 may be modified in accordance with an embodiment of the present invention. For example, the inverter 420 may be omitted and the NOR gate 405 may be replaced with an OR gate. Other modifications may be appropriately made for the embodiment disclosed in FIG. 4.

Figure 5:
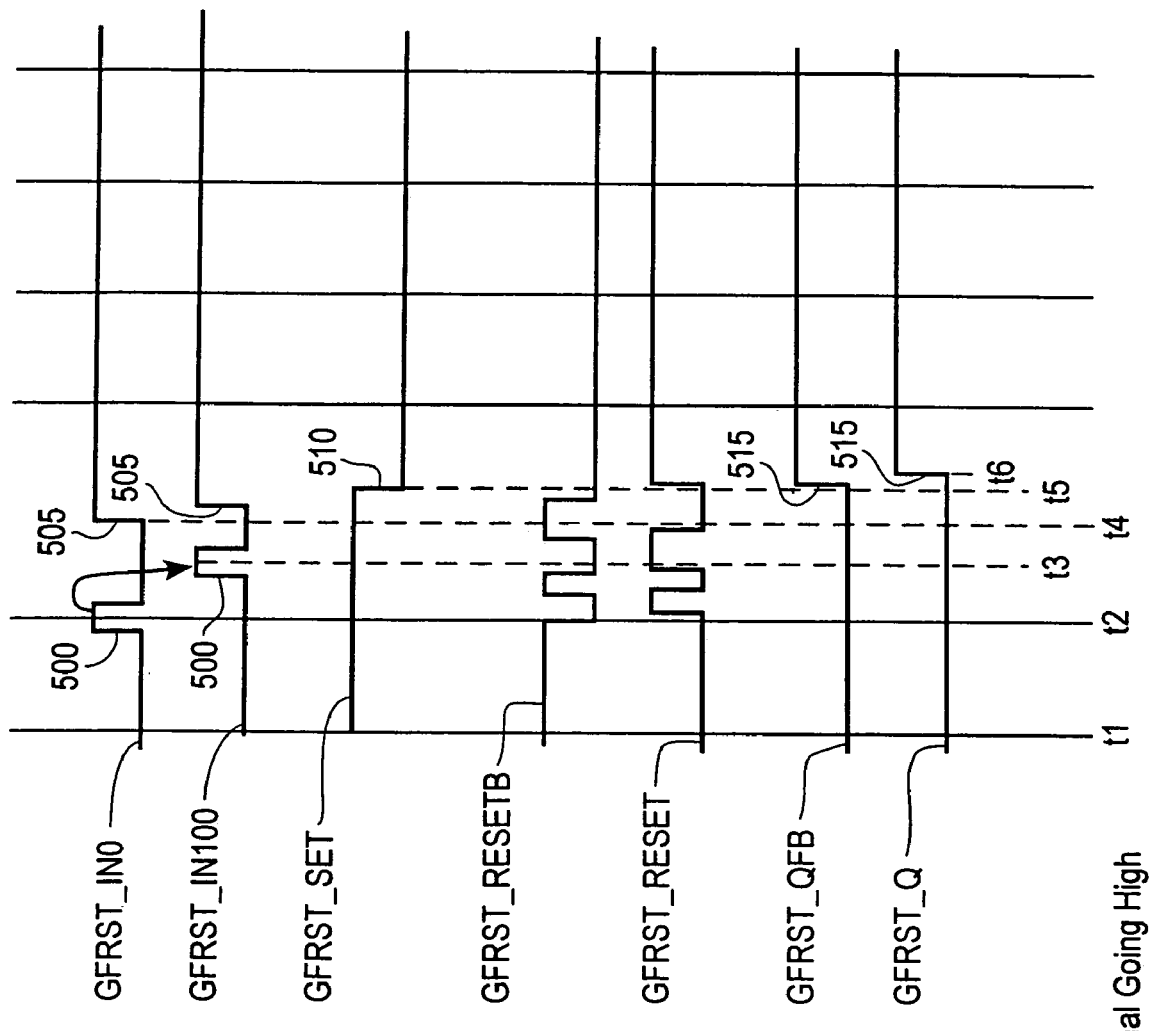
FIG. 5 illustrates various example waveform diagrams of the signals that are processed in the reset circuit of FIG. 4, with the incoming reset signal (GFRST_IN0) shown as switching to a high state.
Figure 6:
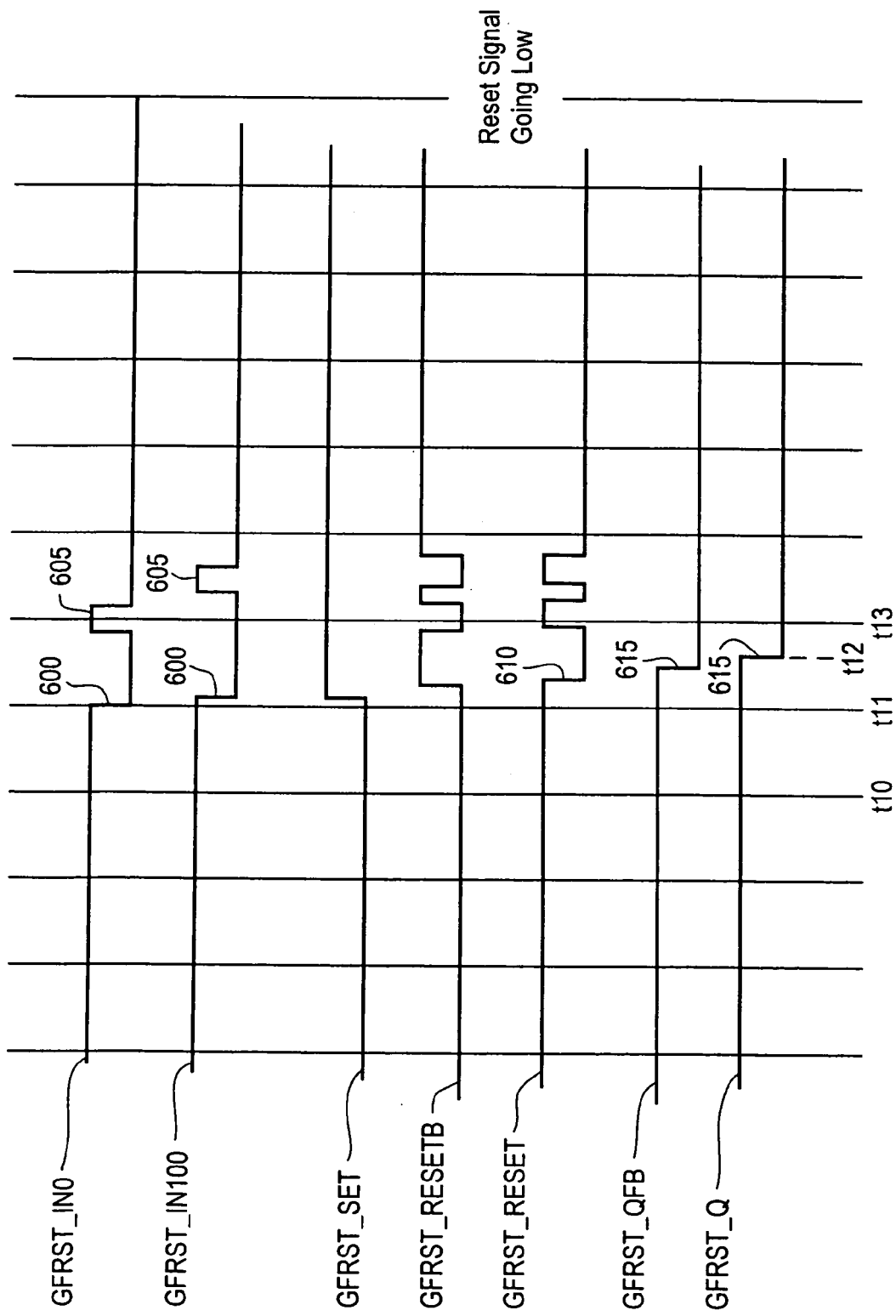
FIG. 6 illustrates various example waveform diagrams of the signals that are processed in the reset circuit of FIG. 4, with the incoming reset signal (GFRST_IN0) shown as switching to a low state.

Reference is now made to the reset circuit 325a in FIG. 4 and the timing diagrams in FIGS. 5 and 6 for purposes of describing the functionality of one embodiment of the present invention. The following logic operations shown in Tables 1 and Table 2 also apply to the appropriate logic components shown in FIG. 4.

TABLE 1

NAND Operation

| Input A | Input B | Output QN |
|---------|---------|-----------|
| 0 | 0 | 1 |
| 0 | 1 | 1 |
| 1 | 0 | 1 |
| 1 | 1 | 0 |

TABLE 2

NOR Operation

| Input A | Input B | Output QN |
|---------|---------|-----------|
| 0 | 0 | 1 |
| 0 | 1 | 0 |
| 1 | 0 | 0 |
| 1 | 1 | 0 |

FIG. 5 illustrates various waveform diagrams of the signals that are processed by the reset circuit of FIG. 3. The waveform diagrams include an incoming reset signal GFRST_IN0 which is the digitized version of the incoming reset signal 330 of FIG. 3. The initial portion of the reset signal GFRST_IN0 is shown, with the reset signal GFRST_IN0 switching from a low state to a high state. FIG. 6 illustrates the remaining portion of the reset signal GFRST_IN0, with the reset signal GFRST_IN0 switching from a high state to a low state. Thus, FIGS. 5 and 6 show the entirety of one example of a reset signal GFRST_IN0 and the entirety of one example of the glitch free output (GFRST_Q) of a reset circuit that is used to reset the appropriate component in an integrated circuit such as graphics chip 305 (FIG. 3).

The GFRST_IN0 reset signal is the incoming reset signal that is generated from the chipset 105 and transmitted across the bus 320 to graphics chip 305 and to other integrated circuits that may be coupled to the bus 320 (such as audio chip 310 and/or other chips 315). The GFRST_IN0 reset signal is received by the first input of NAND gate 400 and by the first input of NAND gate 405.

The GFRST_IN100 delayed reset signal is a delayed version of the GFRST_IN0 reset signal. In one embodiment, a delay stage 450 is used to delay the GFRST_IN0 reset signal to generate the GFRST_IN100 delayed reset signal. The delay stage 450 may be formed by, for example, one-hundred delay elements in an array. The delay stage 450 compensates for glitches that may occur in the GFRST_IN0 incoming reset signal and enables the generation of the glitch free signal GFRST_Q which is applied to appropriate components in an integrated circuit.

Table 3 shows some input and output values for the S-R flop 410 at successive times (Tn, Tn+1, Tn+2, and Tn+3, and so forth). These values show when the GFRST_QFB output value of the S-R flop 410 switches from a low level to a high level.

TABLE 3

Operation of S-R Flop 410 (when the reset signal switches to high

| NAND 425 INPUT A (GFRST_SET) | NAND 425 INPUT B (NAND 430 OUTPUT QN) | NAND 425 OUTPUT QN (GFRST_QFB) | NAND 430 INPUT A (NAND 425 OUTPUT QN) | NAND 430 INPUT B (GFRST_RESET) | NAND 430 OUTPUT QN |
|---|---|---|---|---|---|
| (Tn) 1 | (Tn) 1 | (Tn + 1) 0 | (Tn) X | (Tn) 0 | (Tn) 1 |
| (Tn + 2) 1 | (Tn + 2) 1 | (Tn + 3) 0 | (Tn + 2) 0 | (Tn + 2) 1 | (Tn + 2) 1 |
| (Tn + 4) 0 | (Tn + 4) 1 | (Tn + 5) 1 | (Tn + 4) 0 | (Tn + 4) 0 | (Tn + 4) 1 |
| (Tn + 6) 0 | (Tn + 6) 1 | (Tn + 7) 1 | (Tn + 6) 1 | (Tn + 6) 1 | (Tn + 6) 0 |

X = don't care value may be located in, for example, in the reset circuit 325 or in the I/O buffer 335 (FIG. 3). Other numbers of delay elements in the array may be implemented in the delay stage 450 in order to vary the delay period of the GFRST_IN100 delayed reset signal.

During initial time t1, the GFRST_IN0 reset signal and the GFRST_IN100 delayed reset signal are at a low level. The GFRST_IN0 and GFRST_IN100 are received by both the NAND gate 400 (FIG. 4) and the NOR gate 405. In response to the low level GFRST_IN0 reset signal and GFRST_IN100 reset signal, the NAND gate 400 outputs a GFRST_SET signal at a high level. In response to the low level GFRST_IN0 reset signal and GFRST_IN100 reset signal, the NOR gate 405 outputs a GFRST_RESETB signal at a high level. The high level GFRST_RESETB signal is inverted by the inverter 420 into a low level GFRST_RESET signal. The high level GFRST_SET signal and the low level GFRST_RESET signal is received by the S-R flop 410. The S-R flop 410 outputs a low GFRST_QFB signal, which the buffer 415 delays as the reset circuit output signal GFRST_Q. This reset circuit output signal is applied to the appropriate components of an integrated circuit such as graphics chip 305 (FIG. 3).

At time t2, a glitch 500 occurs in the GFRST_IN0 incoming reset signal, and the glitch 500 is delayed by the array 450, as shown at time t3 in the GFRST_IN100 delayed reset signal. At time t4, the edge 505 in the GFRST_IN0 signal occurs as the GFRST_IN0 signal switches from a low level to a high level. This edge 505 is delayed by the array 450 as shown in the GFRST_IN100 delayed reset signal.

When the GFRST_IN0 and GRFST_IN100 signals both switch high, the GFRST_SET signal will switch to a low level, as shown by edge 510 at time t5. When the GFRST_SET signal switches to a low level, the GFRST_QFB signal will switch to a high level as shown by edge 515. This edge 515 is delayed by buffer 415, as shown in the GFRST_Q signal during time t6. The high level GFRST_Q signal is applied to all appropriate components in the integrated circuit (e.g., graphics chip 305) as a reset signal. As shown in FIG. 5, the GFRST_Q signal does not have glitch occurrence. Thus, the reset circuit 325a (FIG. 4) advantageously It is noted further that the delay applied to the GFRST_IN0 incoming reset signal can be minimized to compensate for small glitches in the GFRST_IN0 incoming reset signal. The delay applied to the GFRST_IN0 incoming reset signal can be increased to compensate for larger glitches in the GFRST_IN0 incoming reset signal.

FIG. 6 illustrates various waveform diagrams of the signals that are processed by the reset circuit of FIG. 3, with the GFRST_IN0 incoming reset signal shown as switching to a low state. At time t10, the GFRST_IN0 incoming reset signal is still at a high level. At time t11, the GFRST_IN0 incoming reset signal switches to a low level as shown by the edge 600 at time t11. This edge 600 is delayed by the array 450 as shown by the edge 600 in GFRST_IN100 delayed incoming reset signal.

It is noted that when the GFRST_RESET signal will switch to a low level as shown by edge 610. The low GFRST_RESET signal will cause the output of NAND 430 to switch to a high level. When the GFRST_SET signal and the output of NAND 430 are both at a high level, then the GFRST_QFB output of NAND 425 will switch to a low level, as shown by edge 615 at time t12. The edge 615 is delayed by buffer 415 as shown by the edge 615 in the GFRST_Q signal at time t12. Thus, after time t12, the GFRST_Q signal (which is applied as the reset signal to the components of an integrated circuit) will be at a low level.

At time t13, a glitch 605 may occur in the GFRST_IN0 incoming reset signal. The delay applied to the GFRST_IN0 glitch and the various components of reset circuit 325 (including S-R flop 410) permit the GFRST_Q signal to remain at a low level even if the glitch 605 occurs in the GFRST_IN0 incoming reset signal.

Table 4 shows some input and output values for the S-R flop 410 at successive times (Tn+10, Tn+11, Tn+12, and Tn+13, and so forth). These values show when the GFRST_QFB output value of the S-R flop 410 switches from a high level to a low level.

TABLE 4

Operation of S-R Flop 410 (when the reset signal switches to high)

| NAND 425 INPUT A (GFRST_SET) | NAND 425 INPUT B (NAND 430 OUTPUT QN) | NAND 425 OUTPUT QN (GFRST_QFB) | NAND 430 INPUT A (NAND 425 OUTPUT QN) | NAND 430 INPUT B (GFRST_RESET) | NAND 430 OUTPUT QN |
|---|---|---|---|---|---|
| (Tn + 10) 0 | (Tn + 10) X | (Tn + 11) 1 | (Tn + 10) 1 | (Tn + 10) 1 | (Tn + 10) 0 |
| (Tn + 12) 1 | (Tn + 12) 0 | (Tn + 13) 1 | (Tn + 12) 1 | (Tn + 12) 1 | (Tn + 12) 0 |
| (Tn + 14) 1 | (Tn + 14) 0 | (Tn + 15) 1 | (Tn + 14) 1 | (Tn + 14) 0 | (Tn + 14) 1 |
| (Tn + 16) 1 | (Tn + 16) 1 | (Tn + 17) 0 | (Tn + 16) 1 | (Tn + 16) 0 | (Tn + 16) 1 |

X = don't care value

Figure 7:
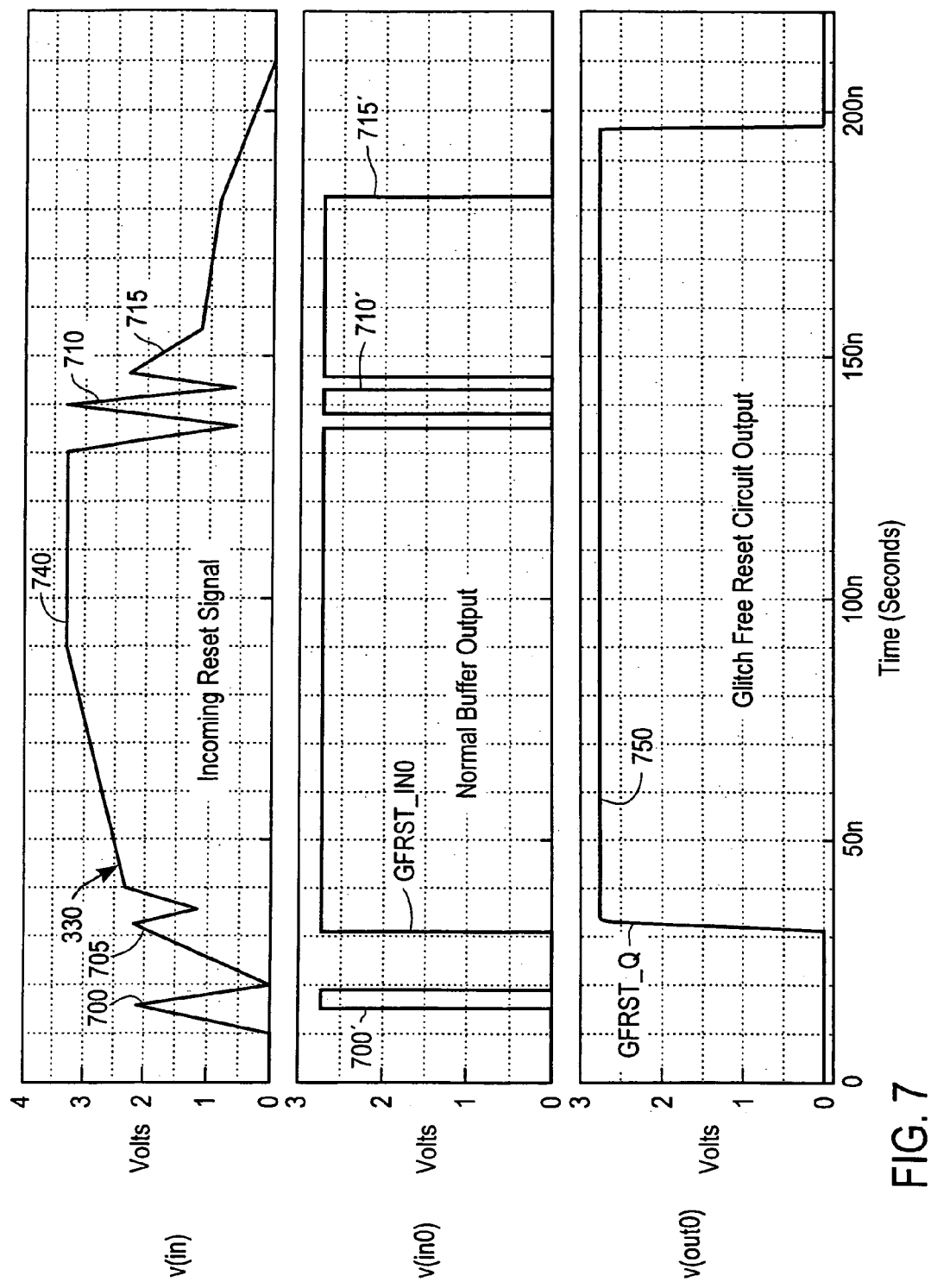
FIG. 7 illustrates various example waveform diagrams including the incoming reset signals with glitch occurrences and the complete output reset signal generated by a reset circuit in accordance with an embodiment of the present invention.

FIG. 7 illustrates various example waveform diagrams as a function of voltage (volts) versus time (seconds). The GFRST_IN0 incoming reset signals may include glitches 700, 705, 710, and 715. The waveform signal 730 is the digitized form of the GFRST_IN0 incoming reset signal. The signal 730 may be digitized by, for example, the input/output buffer 335 (FIG. 3). As shown in FIG. 7, the digitized waveform signal (GFRST_IN0) includes glitches 700', 710', and 715' which are due to the glitches 700, 710, and 715, respectively. The reset circuit 325a (FIG. 4) permits the glitch free signal GFRST_Q to be generated and to be applied as a reset signal to appropriate components in an integrated circuit.

As further shown in FIG. 7, the reset circuit permits the glitches 700 and 705 (occurring before the high state portion 740) and the glitches 715 and 715 (occurring after the high state portion 740) to be filtered. As a result, glitches will not occur before and after the high portion 750 of the GFRST_Q signal.

Figure 8:
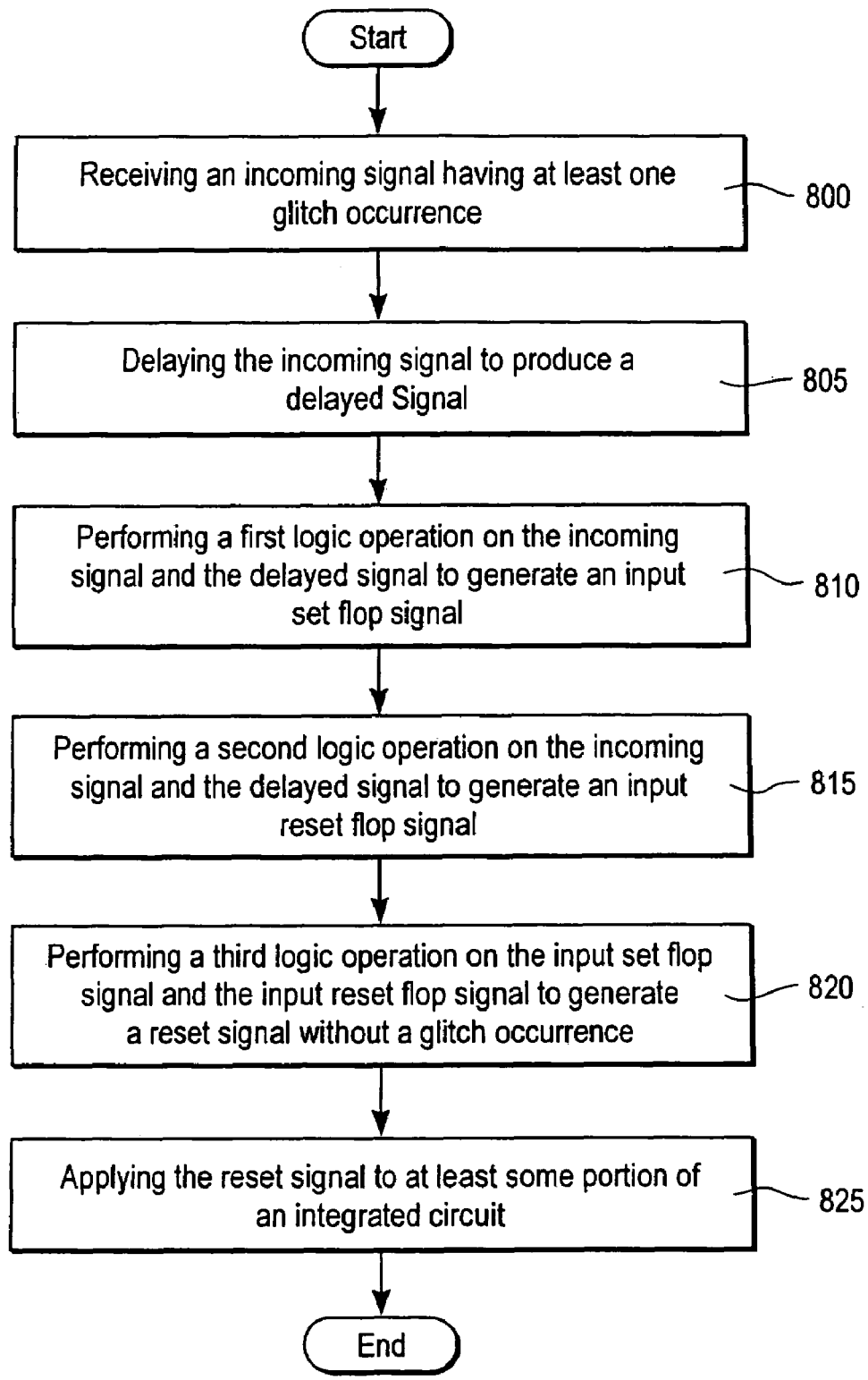
FIG. 8 is a flowchart diagram of a method of compensating for glitch occurrence in an incoming reset signal, in accordance with an embodiment of the present invention.

FIG. 8 is a flowchart diagram of a method of compensating for glitch occurrence in an incoming reset signal, in accordance with an embodiment of the present invention. An incoming signal is first received (800), with the incoming signal having at least one glitch occurrence. For example, this incoming signal may be the GFRST_IN0 digitized incoming reset signal in FIG. 4. The incoming signal is also delayed (805) to produce a delayed signal. For example, the incoming signal may be delayed by delay stage 450 (FIG. 4) to produce the GFRST_IN100 delayed incoming reset signal. A first logic operation is performed (810) on the incoming signal and the delayed signal to generate an input set flop signal. A second logic operation is performed (815) on the incoming signal and the delayed signal to generate an input reset flop signal. The performed logic operations (810) and (815) may be performed substantially at the same time. As an example, the first logic operation is performed (810) on the GFRST_IN0 signal and the GFRST_IN100 delayed signal by the NAND gate 400 (FIG. 4) to generate the GFRST_SET input set flop signal, while the second logic operation is performed (815) on the GFRST_IN0 signal and the GFRST_IN100 delayed signal by the NOR gate 405 (FIG. 4) to generate the GFRST_RESETB signal. In one embodiment, the GFRST_RESETB signal is inverted by inverter 420 to generate the GFRST_RESET input reset flop signal.

A third logic operation is then performed (820) on the input set flop signal and the input reset flop signal to generate a reset signal without a glitch. For example, the third logic operation is performed (820) on the GFRST_SET input set flop signal and the GFRST_RESET input reset flop signal by the S-R flop 410 (FIG. 4) to generate the GFRST_QFB reset signal without a glitch occurrence. The GFRST_QFB reset signal can be applied (825) to at least some portion of an integrated circuit as a reset signal. In one embodiment, the GFRST_QFB reset signal is buffered by the buffer 415 (FIG. 4) to generate the GFRST_Q buffered reset signal which is applied to at least some portion of an integrated circuit as a reset signal.

Figure 9:
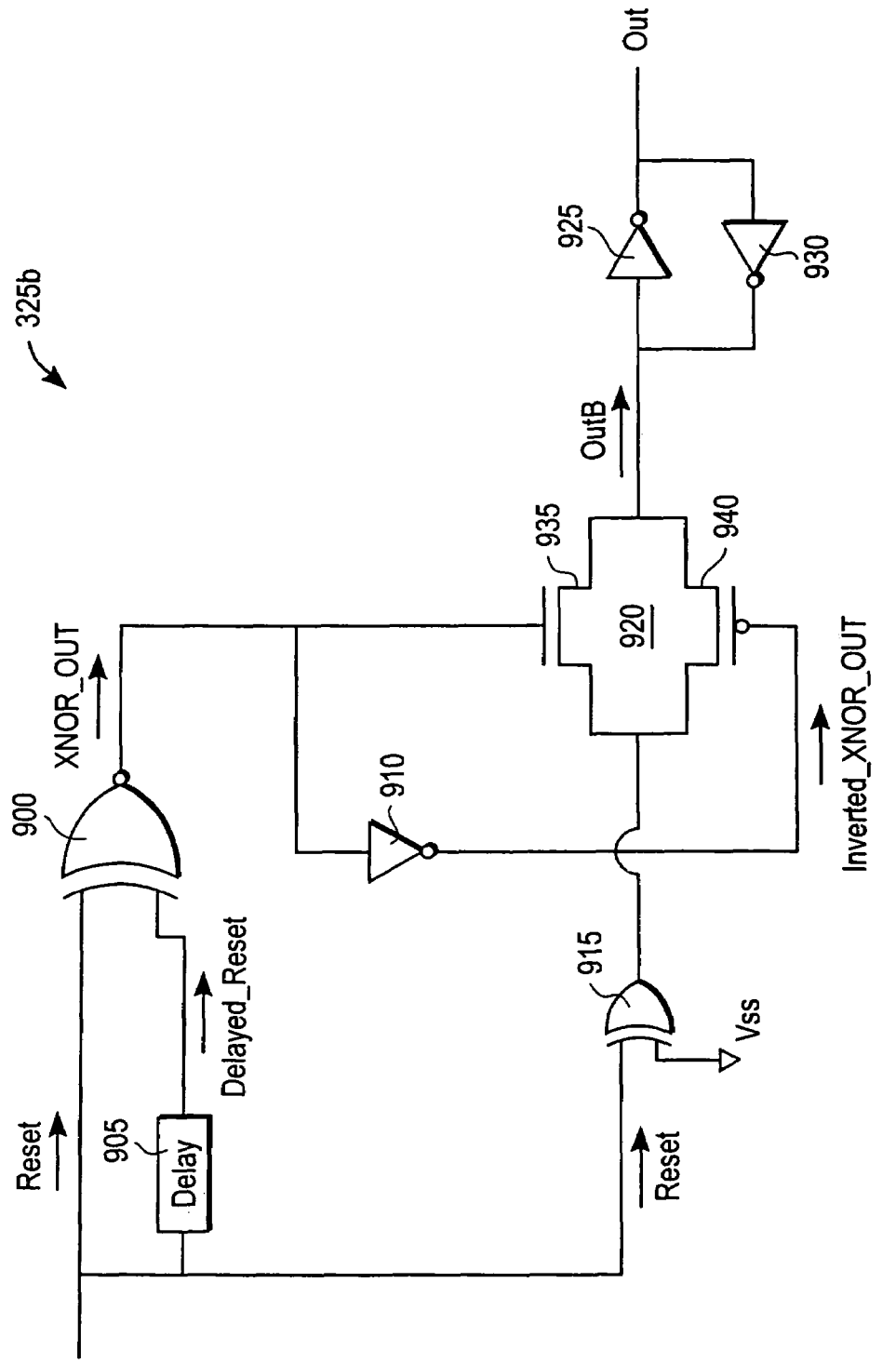
FIG. 9 is a schematic circuit diagram of a second embodiment of the reset circuit of FIG. 3.

FIG. 9 illustrates another embodiment of a reset circuit of FIG. 3. The reset circuit (sample-hold circuit) 325b receives an incoming reset signal "reset" and delays an incoming reset signal to generate a delayed reset signal "delayed_reset". The sample-hold circuit 325b compares the delayed_reset delayed reset signal with the non-delayed reset signal. When both the non-delayed reset signal and the delayed_reset signal are the same state (asserted or non-asserted), then the non-delayed reset signal is sampled as the output value "OUTB". On the other hand, if the non-delayed reset signal and the delayed_reset signal are not the same state, then the non-delayed reset signal is not sampled, and the previously sampled state of the non-delayed reset signal is held at the output value "OUTB".

In one embodiment, the reset circuit (sample-hold circuit) 325b includes an XNOR gate 900, a delay stage (e.g., array) 905, an inverter 910, an optional XOR gate 915, a pass-through circuit 920, and inverters 925 and 930. The pass-through circuit 920 includes N-channel transistor 935 and P-channel transistor 940.

Figure 10:
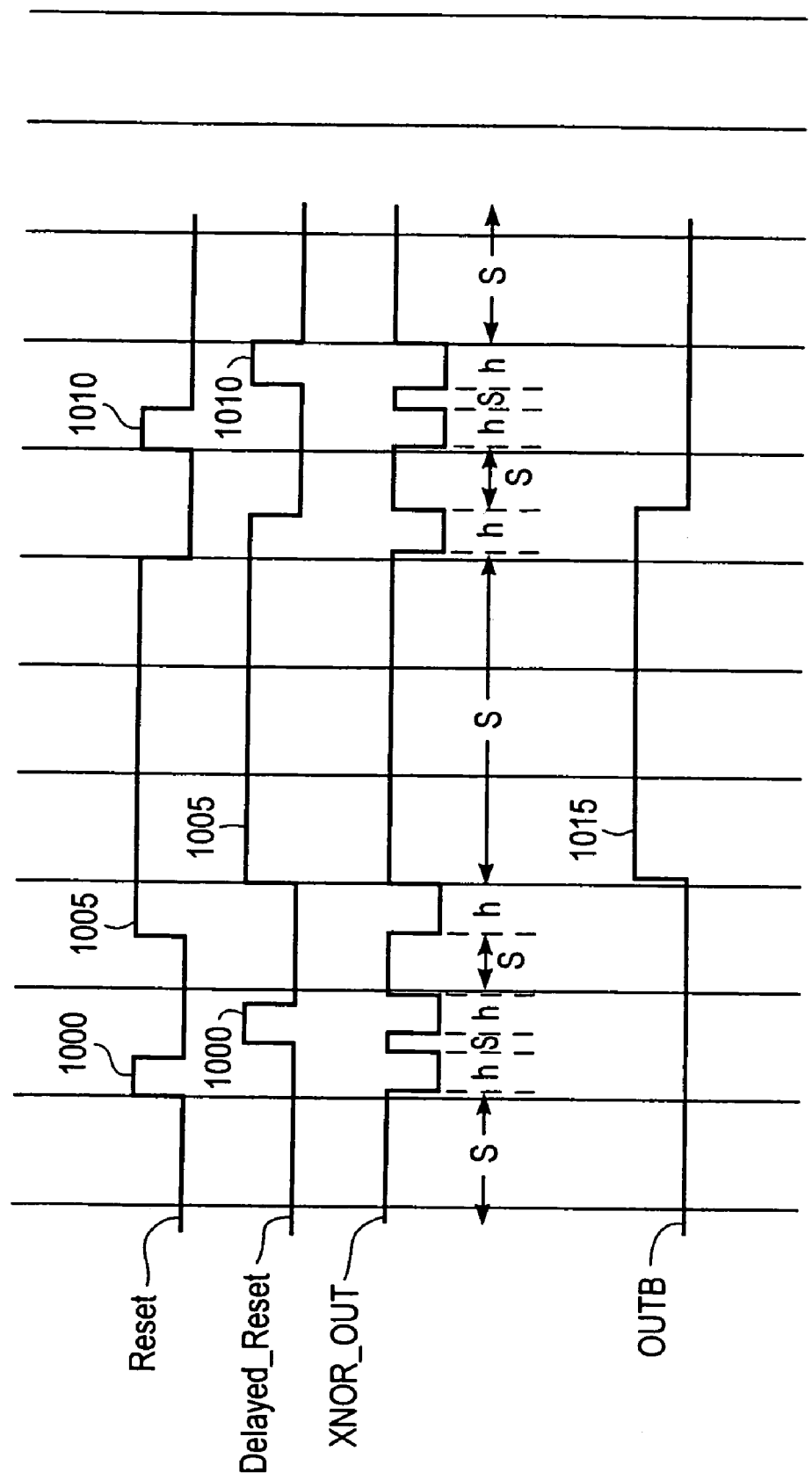
FIG. 10 illustrates various example waveform diagrams of the signals that are processed by the reset circuit of FIG. 9.

Reference is now made to the reset circuit 325b in FIG. 9 and the timing diagrams in FIG. 10. The following logic operations shown in Tables 5 and Table 6 also apply to the appropriate logic components shown in FIG. 9.

TABLE 5

XOR Operation

| Input A | Input B | Output QN |
|---|---|---|
| 0 | 0 | 0 |
| 0 | 1 | 1 |
| 1 | 0 | 1 |
| 1 | 1 | 0 |

TABLE 6

XNOR Operation

| Input A | Input B | Output QN |
|---|---|---|
| 0 | 0 | 1 |
| 0 | 1 | 0 |
| 1 | 0 | 0 |
| 1 | 1 | 1 |

The delay element 905 delays the incoming "reset" signal as the delayed signal "delayed_reset". Thus, a glitch 1000 in the reset signal will be shown as the delayed glitch 1000 in the delayed_reset signal. Similarly, the positive pulse 1005 in the incoming reset signal will also be delayed as shown in the delayed_reset signal. Similarly, a glitch 1010 that may occur in the incoming reset signal will also be delayed as shown in the delayed_reset signal. The XNOR gate 900 output signal, XNOR_OUT, is determined by the logic operation shown in Table 6. Thus, when both of the reset signal and the delayed_reset signal are in the same state (e.g., when the reset signal and the delayed_reset signal are both low, or when the reset signal and the delayed_reset signal are both high), then the XNOR_OUT value will be high. The interval when the XNOR_OUT value is high is indicated by "s" in FIG. 10. When both of the reset signal and the delayed_reset signal are in opposite states (e.g., when the reset signal is high and the delayed_reset signal is low; or when the reset signal is low and the delayed_reset signal is high), then the XNOR_OUT value will be low. The interval when the XNOR_OUT value is low is indicated by "h" in FIG. 10.

When XNOR_OUT is high, then the N-channel transistor 935 is on because the gate of transistor 935 is receiving the high XNOR_OUT signal. The high XNOR_OUT signal is also inverted by the inverter 910 into a low inverted_XNOR_OUT signal that turns on the P-channel transistor 940. Since both of the transistors 935 and 940 are on, the pass-through circuit 920 will pass through the reset signal. Thus, the value of the reset signal is sampled (as indicated by "s") and will be the value of OUTB signal.

When XNOR_OUT is low, then the N-channel transistor 935 is off because the gate of transistor 935 is receiving the low XNOR_OUT signal. The low XNOR_OUT signal is also inverted by the inverter 910 into a high inverted_XNOR_OUT signal that turns off the P-channel transistor 940. Since both of the transistors 935 and 940 are off, the pass-through circuit 920 will not pass through the reset signal. Thus, the current value of the reset signal will be held (as indicated by "h") and will be the value of OUTB signal.

As shown in FIG. 10, the OUTB signal properly remains low if a glitch 1000 or 1010 occurs in the reset signal. The OUTB signal properly goes high when the positive pulse 1005 of the reset signal is received by the reset circuit 325*b*.

In one embodiment, the XOR gate 915 serves to add additional delay to the reset signal to set the timing of arrival to the pass-through circuit 920 of the XNOR_OUT signal, the inverted_XNOR_OUT signal, and the reset signal.

Figure 11:
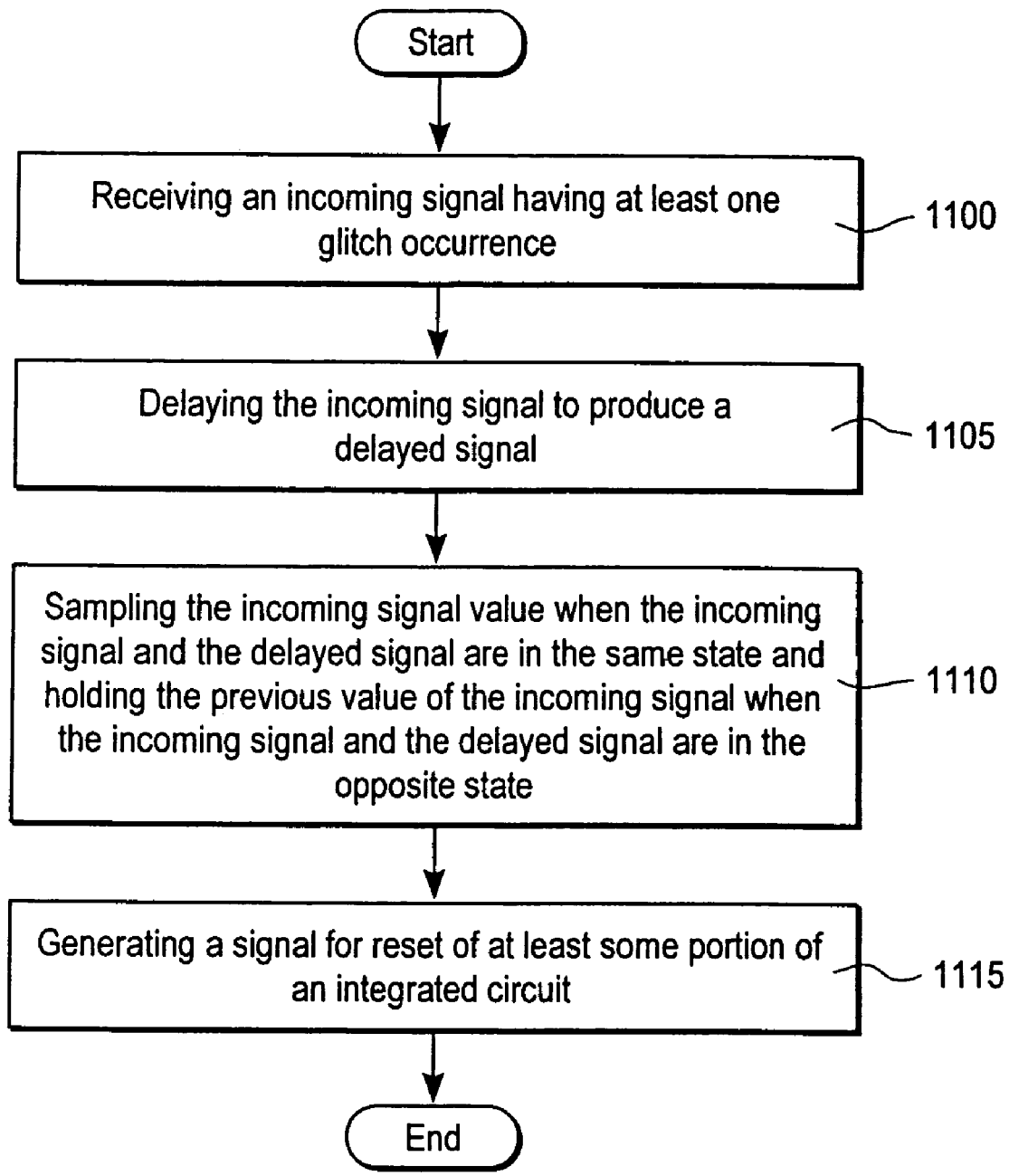
FIG. 11 is a flowchart diagram of a method of compensating for glitch occurrence in an incoming reset signal, in accordance with another embodiment of the present invention.

FIG. 11 is a flowchart diagram of a method of compensating for glitch occurrence in an incoming reset signal, in accordance with another embodiment of the present invention. An incoming signal is first received (1100), with the incoming signal having at least one glitch occurrence. For example, this incoming signal may be the "reset" signal in FIG. 10. The incoming signal is also delayed (1105) to produce a delayed signal. For example, the incoming signal may be delayed by array 905 (FIG. 10) to produce the "delayed_reset" signal. The following operation is then performed (1110) where the incoming signal value is sampled when the incoming signal and the delayed signal are in the same state, and where the previous value of the incoming signal is held when the incoming signal and the delayed signal are in the opposite state. For example, an XNOR gate 900 and a pass-through circuit 935 are used for sampling the values of and/or holding the previous values of the incoming signal. Based on the sampled values of the incoming signal and the held values of the incoming signal, a signal is then generated (1115) for use as a reset signal for at least some portion of an integrated circuit.

The reset circuits described above are very versatile and can be used in any portion of a circuit board to compensate for glitches in the reset signals. For example, a reset circuit in accordance with an embodiment of the invention can be implemented internally to an integrated circuit or may be implemented externally to an integrated circuit. Other variations and modifications of the above-described embodiments and methods are possible in light of the foregoing teaching.

Further, at least some of the components of this invention may be implemented by using a programmed general-purpose digital computer, by using application specific integrated circuits or field programmable gate arrays, or by using a network of interconnected components and circuits, and/or by use of discrete elements.

It is also within the scope of the present invention to implement a program or code that can be stored in an electronically-readable medium to permit a computer to perform any of the methods described above.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus for compensating for glitch occurrence in a reset signal that is applied in an integrated circuit, the apparatus comprising:
    a logic stage capable to process an incoming signal and a delayed incoming signal that is a delayed version of the incoming signal, the logic stage capable to generate an output signal so that when the incoming signal and the delayed incoming signal are in the same state, the output signal will have a state similar to the state of the incoming signal, and when the incoming signal and the delayed incoming signal are not in the same state, the output signal will have a state similar to a previously sampled state of the incoming signal, the logic stage including an exclusive NOR gate and a pass-through circuit communicatively coupled to the exclusive NOR gate and capable to pass through the incoming signal in response to an output value from the exclusive NOR gate.

2. The apparatus of claim 1 wherein the pass through circuit including an N-type transistor and a P-type transistor.

3. The apparatus of claim 1 wherein the delayed incoming signal is delayed by a delay stage.

4. The apparatus of claim 1 wherein the logic portion is capable to filter at least one of a first glitch occurring before a high state portion of the incoming signal and a second glitch occurring after the high state portion of the incoming signal.

5. A method of compensating for a glitch in an incoming signal used for resetting an integrated circuit, the method comprising:
- receiving an incoming signal;
- delaying a glitch occurrence in an incoming signal into a delayed incoming signal;
- performing a logic operation on the incoming signal and the delayed incoming signal;
- transmitting an output from the logic operation to a gate of a first transistor of a pass through circuit:
- inverting the output from the logic operation for transmission to a gate of a second transistor of the pass through circuit: and
- generating an output signal from the pass through circuit so that when the incoming signal and the delayed incoming signal are in the same state, the output signal will have a state similar to the state of the incoming signal, and when the incoming signal and the delayed incoming signal are not in the same state, the output signal will have a state similar to a previously sampled state of the incoming signal.

6. The method of claim 5, further comprising:
- applying the generated output signal as a reset signal to at least some portion of an integrated circuit.

7. The method of claim 5 wherein the generating the output signal comprises:
- filtering at least one of a first glitch occurring before a high state portion of the incoming signal and a second glitch occurring after the high state portion of the incoming signal.

8. The method of claim 5, wherein the first transistor is a P-type transistor and the second transistor is an N-type transistor.

9. The method of claim 5, wherein generating the output signal comprises:
- turning off both the second transistor and the first transistor.

10. The method of claim 5, wherein generating the output signal comprises:
- turning on both the second transistor and the first transistor.

* * * * *